US011746018B2

(12) United States Patent
Yeh et al.

(10) Patent No.: US 11,746,018 B2
(45) Date of Patent: Sep. 5, 2023

(54) NANOSCALE STRAIN ENGINEERING OF GRAPHENE DEVICES WITH TUNEABLE ELECTRONIC CORRELATION FOR QUANTUM VALLEYTRONICS AND SPINTRONICS

(71) Applicant: California Institute of Technology, Pasadena, CA (US)

(72) Inventors: Nai-Chang Yeh, Pasadena, CA (US); Chen-Chih Hsu, Pasadena, CA (US); Jiaqing Wang, Pasadena, CA (US); Marcus L. Teague, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 7 days.

(21) Appl. No.: 17/314,873

(22) Filed: May 7, 2021

(65) Prior Publication Data

US 2022/0281749 A1 Sep. 8, 2022

Related U.S. Application Data

(60) Provisional application No. 63/157,912, filed on Mar. 8, 2021.

(51) Int. Cl.
*G01R 33/12* (2006.01)
*C01B 32/186* (2017.01)
(Continued)

(52) U.S. Cl.
CPC .......... *C01B 32/186* (2017.08); *G01R 33/072* (2013.01); *H10N 52/01* (2023.02);
(Continued)

(58) Field of Classification Search
CPC ...... G01R 33/072; H01L 43/04; H01L 43/065
See application file for complete search history.

(56) References Cited

U.S. PATENT DOCUMENTS 10,041,168 B2  8/2018  Boyd et al.
10,465,291 B2  11/2019  Yeh et al.
(Continued)

OTHER PUBLICATIONS

Bistritzer, R. & MacDonald, A. H. Moire bands in twisted double-layer graphene. Proc. Natl Acad. Sci. USA 108, 12233-12237 (2011).

(Continued)

*Primary Examiner* — Dominic E Hawkins
(74) *Attorney, Agent, or Firm* — Gates & Cooper LLP

(57) ABSTRACT

A strain engineered material including a monolayer graphene sheet comprising an array of wrinkles induced by deformations in the graphene sheet, the deformations formed by a lattice of underlying nanostructures on a substrate. The lattice of nanostructures comprises rows of the nanostructures and each of the wrinkles comprise a ridge aligned on top of a different one of the rows and along an alignment direction defined by the rows. The deformations pattern a strain distribution in the graphene sheet that induces a periodically varying pseudo magnetic field distribution ranging between a positive value and a negative values. The periodically varying pseudo magnetic field distribution has field magnitude minima located parallel to and between the ridges and field magnitude maxima located near to and parallel to each of the ridges and can be designed for various valleytronic and spintronic device applications.

20 Claims, 13 Drawing Sheets

(51) Int. Cl.
    *G01R 33/07*   (2006.01)
    *H10N 52/01*   (2023.01)
    *H10N 52/80*   (2023.01)
    *H10N 52/00*   (2023.01)

(52) U.S. Cl.
    CPC ........... *H10N 52/101* (2023.02); *H10N 52/80* (2023.02); *G01R 33/1284* (2013.01)

(56) References Cited

U.S. PATENT DOCUMENTS

| | | | |
|---|---|---|---|
| 10,837,102 B2 | 11/2020 | Boyd et al. | |
| 2011/0269299 A1* | 11/2011 | Zhang | H01L 21/0254 977/734 |
| 2014/0017839 A1* | 1/2014 | Li | H01L 31/1013 257/466 |
| 2019/0243208 A1* | 8/2019 | Peng | G02F 1/29 |

OTHER PUBLICATIONS

Boyd D. A. et al. Single-step deposition of high-mobility graphene at reduced temperatures Nature Communications 6, 6620 (2015).

Cao, Y. et al. Unconventional superconductivity in magic-angle graphene superlattices. Nature 556, 80 (2018).

Guinea F. et al. Energy gaps and a zero-field quantum Hall effect in graphene by strain engineering. Nat. Phys. 6, 30-33 (2010).

Guinea, F., Katsnelson, M. I. and Vozmediano, M. A. H. Midgap states and charge inhomogeneities in corrugated graphene. Phys. Rev. B 77, 075422 (2008).

Levy N. et al. Strain-induced pseudomagnetic fields greater than 300 Tesla in graphene nanobubbles. Science 329, 544 (2010).

N.-C. Yeh et al., ActaMechanicaSinica32, 497-509 (2016).

Nanoscale strain engineering of giant pseudo-magnetic fields, valley polarization, and topological channels in graphene, C.-C. Hsu, M. L. Teague, J.-Q. Wang, and N.-C. Yeh, Science Advances May 8, 2020: vol. 6, No. 19, eaat9488, DOI: 10.1126/sciadv.aat9488, https://advances.sciencemag.org/content/6/19/eaat9488/tab-pdf.

Teague, M. L. et al. Evidence for strain-induced local conductance modulations in single-layer graphene on SiO2. Mano Lett. 9, 2542-2546 (2009).

Xu, F. et al. Strain-induced superconducting pair density wave states in graphene. Phys. Rev. B 98, 205103 (2018).

Yeh N.-C. et al. Nanoscale strain engineering of graphene and graphene-based devices. Acta Mech. Sin. 32, 497-509 (2016).

Yeh N.-C. et al. Strain-induced pseudomagnetic fields and charging effects on CVD-grown graphene. Surf. Sci. 605, 1649-1656 (2011).

* cited by examiner

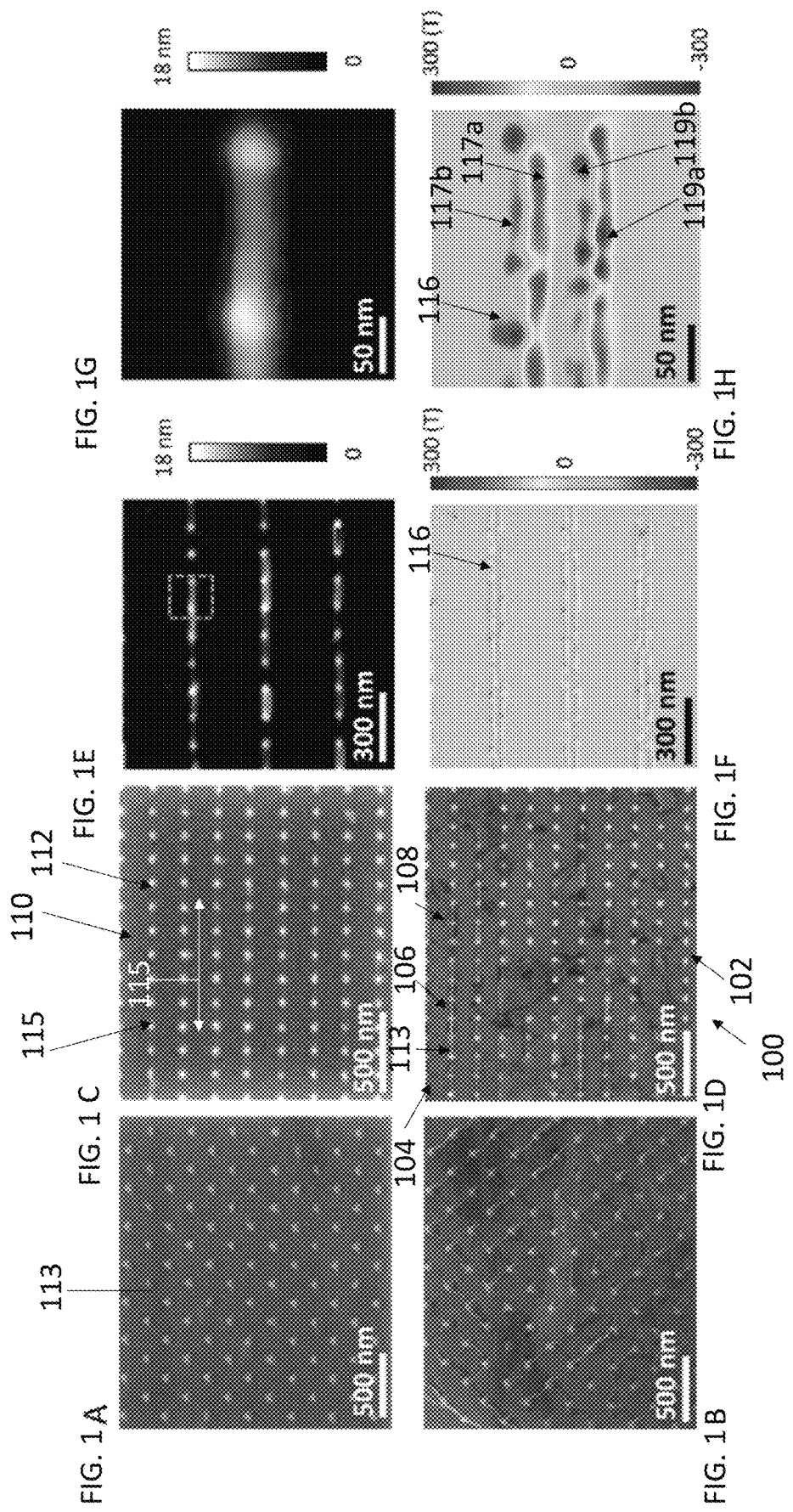

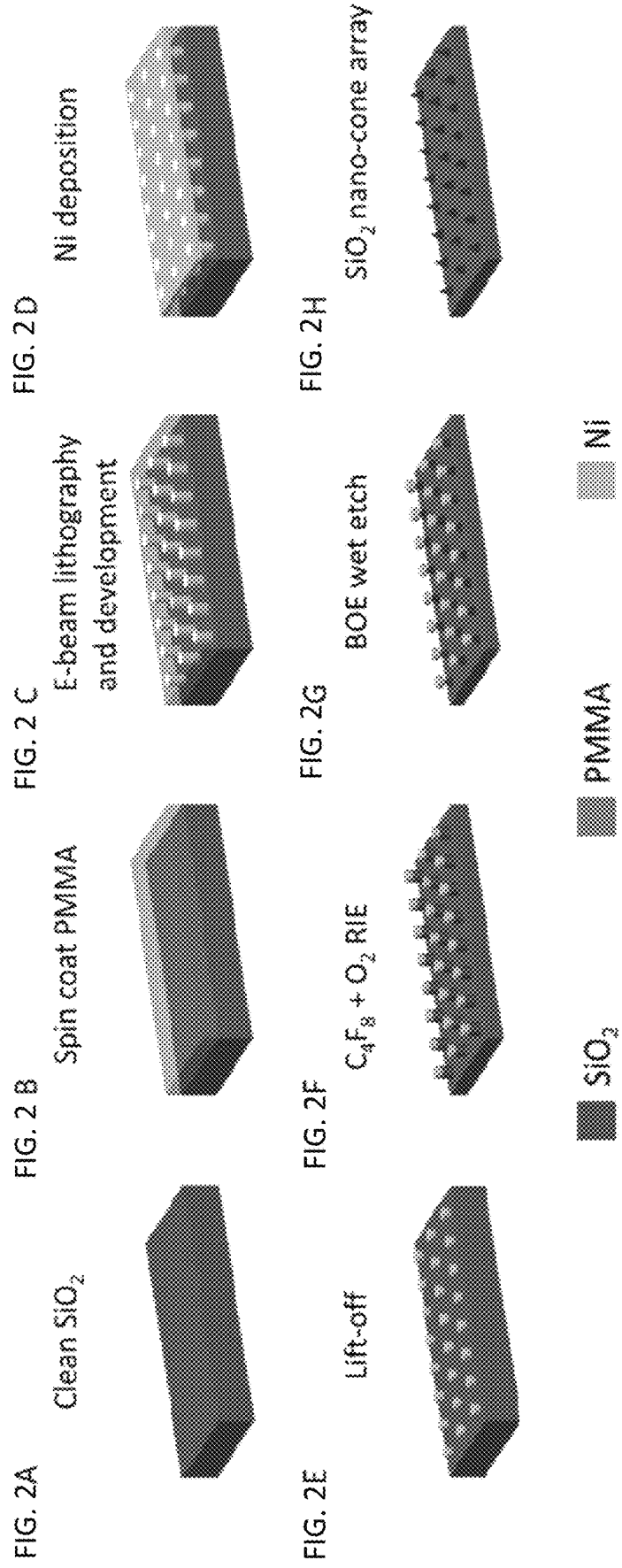

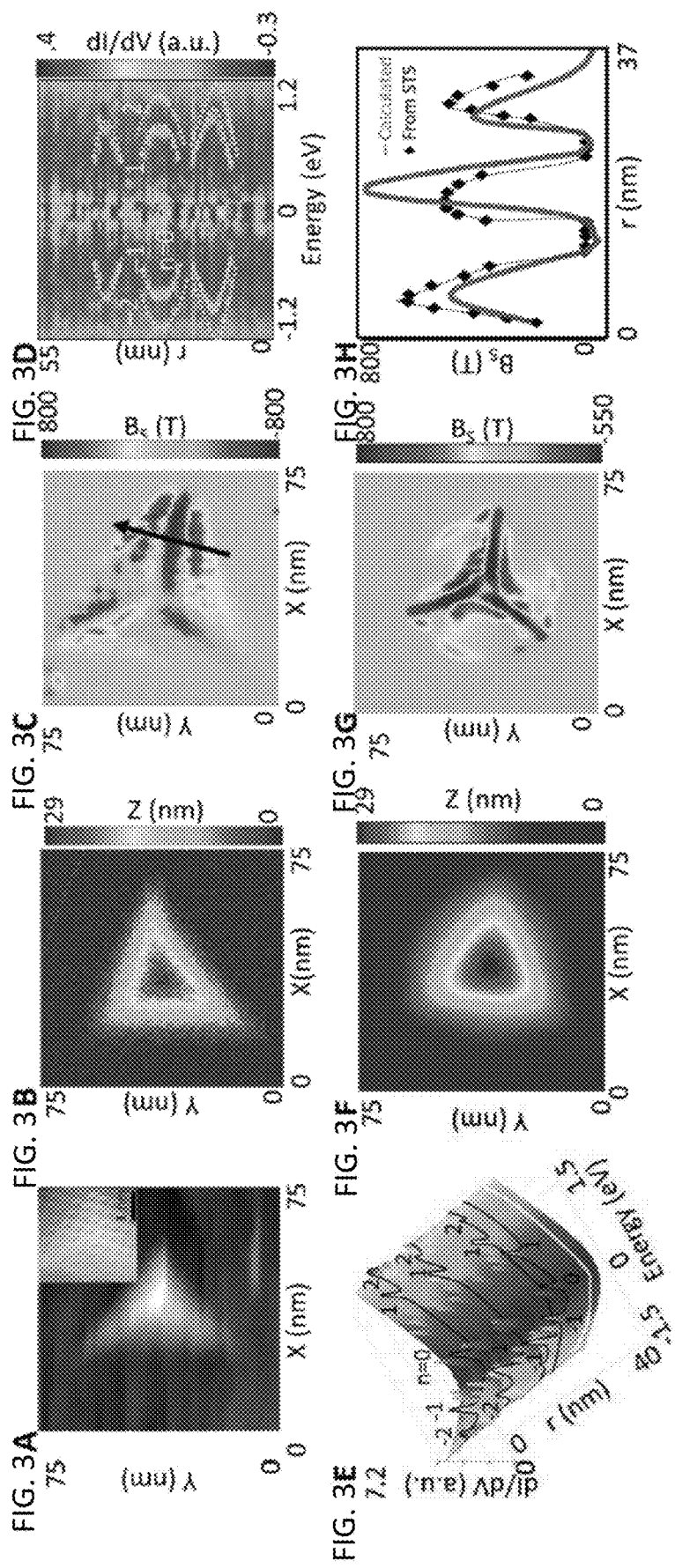

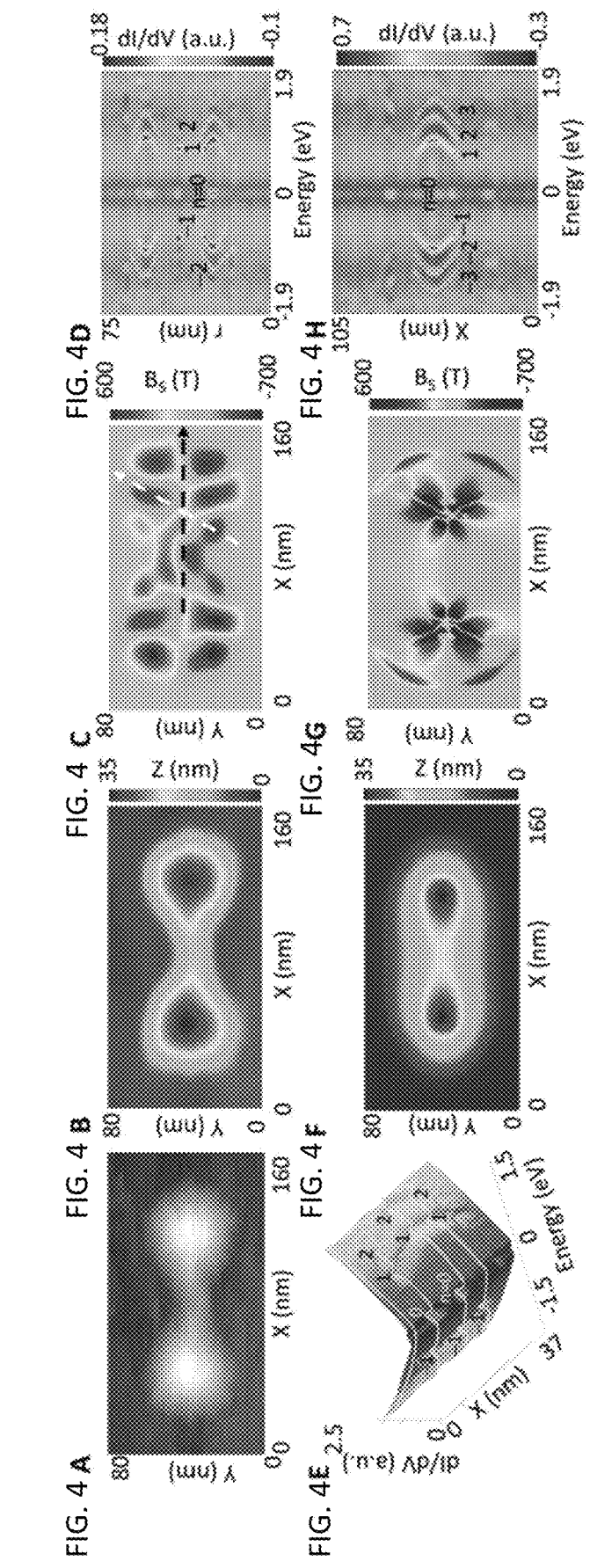

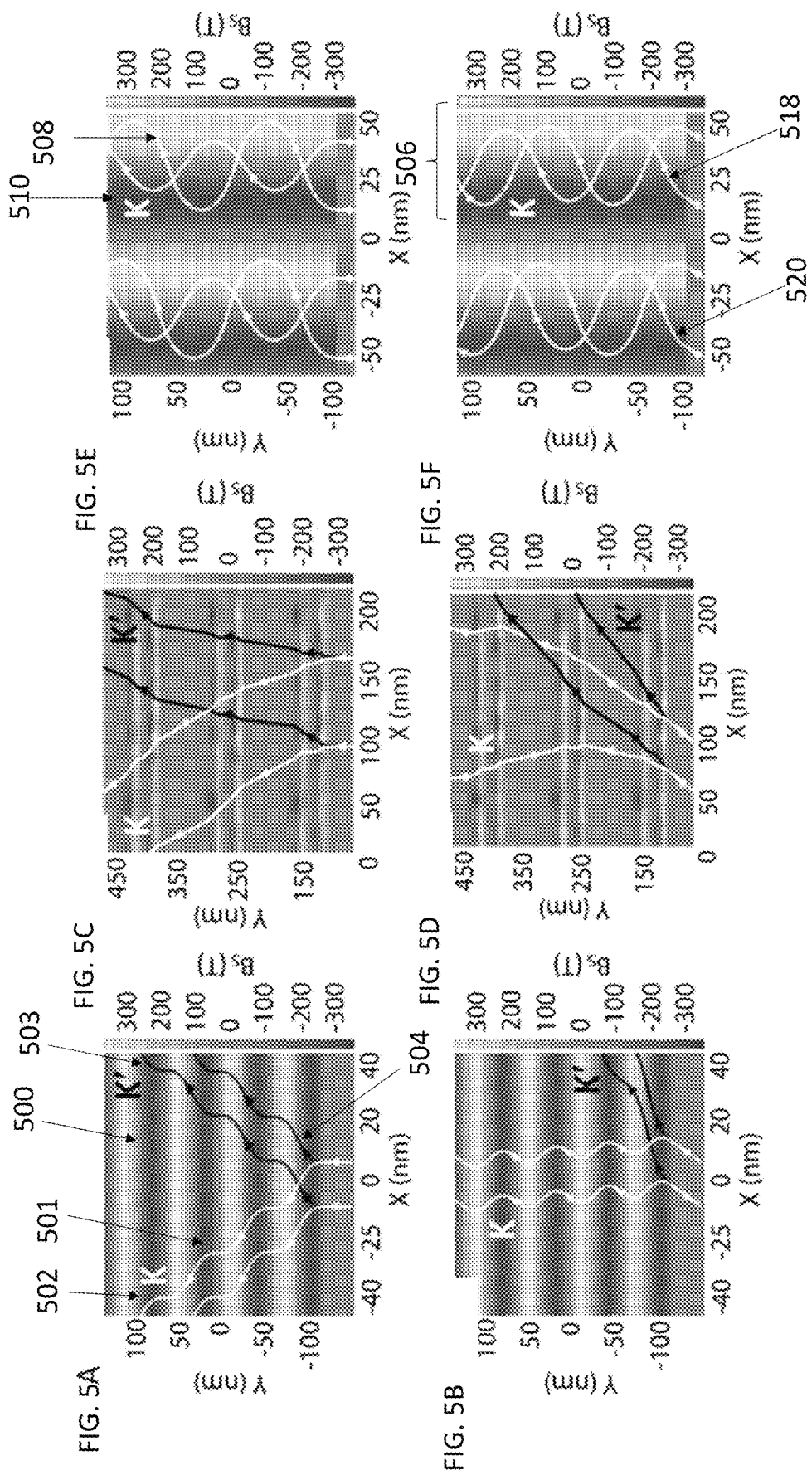

NANOSCALE STRAIN ENGINEERING OF GRAPHENE DEVICES WITH TUNEABLE ELECTRONIC CORRELATION FOR QUANTUM VALLEYTRONICS AND SPINTRONICS

CROSS REFERENCE TO RELATED APPLICATIONS

This application claims the benefit under 35 USC 119(e) of commonly assigned U.S. Provisional Patent Application Ser. No. 63/157,912, filed Mar. 8, 2021, by Nai-Chang Yeh, Chen-Chip Hsu, Jiaqing Wang, Marcus L. Teague, entitled "NANOSCALE STRAIN ENGINEERING OF GRAPHENE DEVICES WITH TUNEABLE ELECTRONIC CORRELATION FOR QUANTUM VALLEYTRONICS AND SPINTRONICS," which application is incorporated by reference herein.

STATEMENT REGARDING FEDERALLY SPONSORED RESEARCH AND DEVELOPMENT

This invention was made with government support under Grant No. W911NF-16-1-0472 awarded by the Army and Grant No. PHY1733907 awarded by the National Science Foundation. The government has certain rights in the invention.

BACKGROUND OF THE INVENTION

1. Field of the Invention

The present invention relates to strain-engineered graphene based devices.

2. Description of the Related Art

Nanoscale strain engineering of monolayer graphene has been theoretically predicted to enable the occurrence of localized giant pseudo-magnetic fields [1,2], which are spatially varying effective magnetic fields that add up to a total of zero magnetic flux and so do not break global time reversal symmetry. On the other hand, strain-induced giant pseudo-magnetic fields can dramatically modify the local electronic properties of graphene at the nanoscale, which have been experimentally verified by us and several other research groups using scanning tunneling microscopy/spectroscopy and Raman spectroscopy [2-7]. In principle, strain engineering can tune the structural distortion of graphene to achieve desirable electronic properties. However, there has been little progress to date in scaling up the strain-induced pseudo-magnetic field effects from nanoscale to realistic device dimensions to demonstrate useful and tunable device characteristics.

SUMMARY OF THE INVENTION

Illustrative, non-exclusive examples of inventive subject matter according to the present disclosure are described in the following enumerated examples.

1. A strain engineered material, comprising:
a monolayer graphene sheet comprising an array of wrinkles induced by deformations in the graphene, sheet, the deformations formed by a lattice of underlying nanostructures on a substrate comprising a dielectric material, wherein:

the lattice comprises rows of the nanostructures;
each of the wrinkles comprise a ridge aligned on top of a different one of the rows and along an alignment direction defined by the rows;
the deformations pattern a strain distribution in the graphene sheet that induces a periodically varying pseudo magnetic field distribution ranging between a positive value and a negative value; and
the periodically varying pseudo magnetic field distribution has field magnitude minima located parallel to and between the ridges and field magnitude maxima located nearer to (as compared to the minima) and parallel to each of the ridges.

2. The strain engineered material of example 1, further comprising an interlayer between the dielectric material and the graphene sheet, wherein the interlayer suppresses the electrical charging effects of impurities and lattice vibrational coupling from the substrate that degrade electrical properties of the graphene sheet.

3. The strain engineered material of example 2, wherein the substrate comprises silicon, the dielectric material comprises silicon dioxide, and the interlayer comprises hexagonal boron nitride with a thickness between one to five atomic layers.

4. The strain engineered material of example 1, wherein:
the nanostructures comprise tapered structures having a height and maximum base width in a range of 10-100 nm, a spacing between adjacent nanostructures in the rows is less than a spacing between the nanostructures in adjacent rows, and a spacing between the rows is in a range of 100-1000 nm.

5. A valley splitter device comprising the strain engineered material of example 1, further comprising:
a first pair of electrodes contacting the graphene sheet and separated by a first distance across the wrinkles so as to channel a flow of current in the graphene sheet in a direction across the array of wrinkles: wherein:
the graphene sheet has an electronic band structure including a first valley and a second valley; and
the periodically varying pseudo magnetic field spatially separates the current into a first flow in a first direction and comprising first charge carriers in the first valley and a second flow in a second direction and comprising second charge carriers in the second valley.

6. The valley splitter device of example 5, further comprising:
a second pair of electrodes electrically contacting the graphene sheet separated by a second distance across the wrinkles so as to measure a first voltage generated across the second pair of electrodes by the first flow; and
a third pair of electrodes electrically contacting the graphene sheet separated by a third distance across the wrinkles so as to measure a second voltage generated across the third pair of electrodes by the second flow.

7. The valley splitter device of example 6 comprising a valley Hall effect transistor, the transistor further comprising:
a gate coupled to the graphene sheet via a dielectric layer so that a gate voltage applied to the gate controls a density of the charge carriers in the transistor comprising the graphene sheet and a resistance of the graphene sheet measured using the first voltage or the second voltage varies as a function of the density.

8. The valley splitter device of example 6, further comprising:

a gate coupled to the graphene sheet so as to control a density of the charge carriers in the current flowing across the wrinkles; and a cooling device thermally coupled to the graphene sheet so as to cool the graphene sheet to a temperature such that:

the periodically varying pseudo magnetic field interacts with the current to generate a quantum valley Hall resistance of the graphene sheet measured using the first voltage or the second voltage, wherein the quantum valley Hall resistance as a function of the density of charge carriers comprises peaks associated with the charge carriers occupying Landau levels generated in the first valley or the second valley by the periodically varying pseudo magnetic field.

9. A spintronic device coupled to the valley splitter device of example 5 and outputting a spin polarized current generated from the first flow.

10A. A valley propagator device comprising the strain engineered material of example 1, wherein:

the graphene sheet comprises an electronic band structure including a first valley and a second valley;

the device further comprises electrodes electrically contacting the graphene sheet and positioned to channel a flow of current in one or more directions parallel to the wrinkles;

the current comprises charge carriers comprising at least one of first charge carriers in the first valley or second charge carriers in the second valley;

the periodically varying pseudo magnetic field comprises multiple pairs of parallel maximum magnitudes of positive and negative magnetic fields; and at least one of the first charge carriers in the first valley or of the second charge carriers in the second valley are confined between one of the pairs.

10B. A valley propagator device comprising the strain engineered material of example 1, wherein:

the graphene sheet comprises an electronic band structure including a first valley and a second valley;

the device further comprises electrodes electrically contacting the graphene sheet and positioned to channel a flow of current in one or more directions parallel to the wrinkles;

the current comprises charge carriers comprising at least first charge carriers in the first valley or second charge carriers in the second valley;

the periodically varying pseudo magnetic field comprises multiple pairs of adjacent parallel maximum magnitudes of positive and negative magnetic fields; and one or more flows of the charge carriers are confined, in the first valley or the second valley, between adjacent ones of the parallel maximum magnitudes of positive and negative magnetic fields, so that one or more of the multiple pairs guide the current in the one or more directions parallel to the wrinkles and along the alignment direction defined by the rows of nanostructures.

11. A spintronic device coupled to the valley propagator device of example 10A or 10B, wherein the spintronic device generates a spin polarized current from the current outputted from the valley propagator device.

12. The spin engineered material of example 1, wherein the strain distribution induces spin-polarized electrical current in the graphene sheet under proper gate voltages applied to the graphene sheet and at sufficiently low temperatures.

13. A Hall effect device comprising the strain engineered material of example 1, further comprising:

a first pair of electrodes positioned to channel a flow of current in graphene sheet along a longitudinal direction parallel to the wrinkles;

a second pair of electrodes separated across the wrinkles and measuring a Hall resistance using a voltage generated across the second pair of electrodes in response to the current; and a cooling device thermally coupled to the graphene sheet so as to cool the graphene sheet to a temperature;

wherein:

the graphene sheet comprises an electronic band structure including a plurality of valleys; and the periodically varying pseudo magnetic field interacts with the current so as to generate an anomalous quantum Hall resistance measured using the voltage and such that the anomalous quantum Hall resistance as a function of the density of charge carriers comprises peaks having values proportional to $(h/e^2)$ associated with the charge carriers occupying spin split Landau levels generated in each of the valleys by the periodically varying pseudo magnetic field.

14. A spintronic device comprising the strain engineered material of example 1, further comprising:

a pair of electrodes electrically contacting the graphene sheet so as to channel a flow of current in the graphene sheet, the current comprising charge carriers; wherein:

the graphene sheet comprises an electronic band structure comprising valleys; and a Coulomb repulsion among charge carriers due to strain-induced spatial confinement polarizes spins of the charge carriers occupying Landau levels, where the Landau levels are generated in each of the valleys by the periodically varying pseudo magnetic field.

15. A transistor comprising the material of example 1.

16. The strain engineered material of example 1, wherein:

the deformations pattern a strain distribution in the graphene sheet that induces superconductivity in the graphene sheet.

17. A method of making a strain engineered material, comprising: depositing a graphene sheet on a lattice of nanofeatures, wherein:

the lattice deforms the graphene sheet so as to induce a periodic array of wrinkles in the graphene sheet;

each of the wrinkles comprise a ridge aligned on top of a different one of the rows and along an alignment direction defined by the rows;

the deformations pattern a strain distribution in the graphene sheet that induces a periodically varying pseudo magnetic field distribution ranging between a positive value and a negative value; and the periodically varying pseudo magnetic field distribution has field magnitude minima located parallel to and between the ridges and field magnitude maxima located nearer to (as compared to the minima) and parallel to each of the ridges.

18, The method of example 17, further comprising:

lithographically patterning the nanofeatures on a substrate comprising a dielectric material and using electron beam lithography; and growing the graphene sheet comprising strain free graphene using Plasma-enhanced chemical vapor deposition (PECVD).

19. The method of example 17, wherein:

the nanostructures comprise tapered structures having a height and maximum base width in a range of 10-100 nm, a spacing between adjacent nanostructures in the rows is less than a spacing between the nanostructures in adjacent rows, and a spacing between the rows is in a range of 100-1000 nm.

20. The method of example 18, wherein the substrate comprises silicon, the dielectric material comprises silicon dioxide, the method further comprising depositing hexagonal boron nitride on the dielectric material and depositing the graphene sheet on the hexagonal boron nitride.

BRIEF DESCRIPTION OF THE DRAWINGS

Referring now to the drawings in which like reference numbers represent corresponding parts throughout:

FIGS. 1A-1H. Strain engineered material and extended strain effects in the strain engineered material induced by periodic arrays of nano-cones on graphene: FIG. 1A: Scanning electron microscopy (SEM) image of triangular arrays of cone-shaped nanostructures fabricated on a $SiO_2$/Si substrate. FIG. 1B: SEM image of monolayer-graphene/h-BN films on the triangular arrays shown in the top panel, showing graphene wrinkles appeared randomly along three equivalent directions. FIG. 1C: SEM image of rectangular arrays of cone-shaped nanostructures fabricated on a $SiO_2$/Si substrate. FIG. 1D: SEM image of monolayer graphene/h-BN films on the rectangular arrays shown in the top panel, showing graphene wrinkles parallel to the axis of closer spaced nanostructures. FIG. 1E, F: Atomic force microscopy (AFM) image (FIG. 1E) of three parallel graphene wrinkles and the corresponding map of pseudo-magnetic fields derived from the strain tensors (FIG. 1F). FIGS. 1G, H: AFM image (FIG. 1G) of the graphene wrinkle enclosed by the blue dashed box in FIG. 1E and the corresponding map of pseudo-magnetic fields derived from the strain tensors (FIG. 1H).

FIGS. 2A-2H. Example $SiO_2$ nano-cone array fabrication process used to fabricate the strain engineered material illustrated in FIG. 1, (A) Si chip with a 300 nm oxide layer was ultra-sonicated in acetone and IPA for 10 min respectively, and then blown dry with nitrogen. (B) Spin coat—100 nm PMMA on the $SiO_2$ and bake on a hot plate at 180° C. for 1 minute. (C) E-beam lithography and development to form ~50 nm diameter discs on the substrate. (D) 15 nm thick Ni layer deposition. (E) Lift off the resist by soaking the chip in acetone overnight. (F) Use $C_4F_8/O_2$ reactive ion etching (RIE) to create $SiO_2$ nano-pillars. (G) Dip the chip in buffered oxide etch (BOE) for ~20 seconds until Ni discs fall off. (H) $SiO_2$ nano-cone array.

FIGS. 3A-3H. Topographic and spectroscopic studies of strain-induced effects on graphene at room temperature due to one Pd tetrahedron nano-crystal (NC): (A) Three-dimensional (3D) topographic images of the distorted graphene taken by AFM (Main Panel) and by scanning tunnelling microscopy (STM) (Inset, zoom-in image with atomic resolution). (B) 3D topographic image of the distorted graphene taken by STM. (C) The pseudo-magnetic field map calculated from the topography over the same area as shown in (B). (D) Tunneling conductance spectral difference relative to the Dirac spectrum of strain-free graphene is shown along the line-cut indicated by the black arrow in (C), revealing spatially varying strengths of strain-induced pseudo-magnetic fields as manifested by the variations in the Landau-level separation. (E) Representative spectra of tunneling conductance-vs.-energy of strained graphene along the black line-cut in (C), showing quantized conductance peaks in strained regions and the V-shape Dirac spectrum in strain-free regions as exemplified by the white curve located at, r=36 nm. (F) 3D topographic map of graphene; h-BN deformation on an ideal tetrahedron, as computed from MD simulations. (G) Pseudo-magnetic field map computed from the topographic distortion in (F). (H) Comparison of the absolute values of pseudo-magnetic fields $|B_S(r)|$ derived from topographic studies (red line) and from the Landau level separations in scanning tunnelling spectroscopy (black diamonds), showing overall satisfactory agreement. Here r denotes the distance measured from the lower-left end to the upper-left end of the black arrow shown in (C).

FIGS. 4A-4H. Topographic and spectroscopic studies of strain-induced effects on graphene due to two closely separated Pd tetrahedron nano-crystals (NCs): (A) Three-dimensional (3D) topographic image of the distorted graphene taken by AFM. (B) 3D topographic image of the distorted graphene taken by STM. (C) The pseudo-magnetic field map calculated from the topography over the same area as shown in (B). (D) The tunneling conductance spectral difference from the Dirac spectrum along the line-cut shown by the white dashed line in (C). (E) Spatially resolved tunneling spectra of strained graphene along the black dashed line in (C), showing strain-induced quantized conductance peaks. (F) 3D topographic map of graphene/h-BN on two ideal tetrahedrons computed from molecular dynamics (MD) simulations. (G) Pseudo-magnetic field map computed from topographic distortion shown in (F). (H) The tunneling conductance spectral difference relative to the Dirac spectrum along the line-cut shown by the black dashed line in (C).

FIGS. 5A-5F. Parallel graphene wrinkles as topological channels for valley splitting and valley-polarized propagation: FIGS. 5A, B: Simulations for parallel graphene wrinkles as a valley splitter, showing the trajectories of initially valley-degenerate (K+K') fermions from strain-free regions becoming split when injected vertically into regions with strain-induced periodic channels of pseudo-magnetic fields, wherein FIG. 5A shows trajectories of K and K' fermions for an incident angle perpendicular to the parallel channels (θ=0 degrees) and FIG. 5B shows trajectories of K- and K'-valley fermions for an incident angle at θ=15 degrees relative to the normal vector of the parallel channels. FIG. 5C: Simulated trajectories of K and K' fermions for an incident angle perpendicular to the realistic strain-induced parallel pseudo-magnetic fields (θ=0 degrees) shown in FIG. 1F. FIG. 5D: Simulated trajectories of K and K' fermions for an incident angle at θ=15 degrees relative to the normal vector of the realistic strain-induced parallel pseudo-magnetic fields shown in FIG. 1F. FIGS. 5E, F: Simulations for parallel graphene wrinkles as a valley propagator, showing the collimation of valley-polarized fermions. FIG. 5E: Trajectories of K-valley fermions incident at an angle parallel to the channels (θ=90 degrees). FIG. 5F: Trajectories of K-valley fermions incident at an angle θ=75 degrees relative to the normal vector of the parallel channels.

DETAILED DESCRIPTION OF THE INVENTION

Figure 1I:
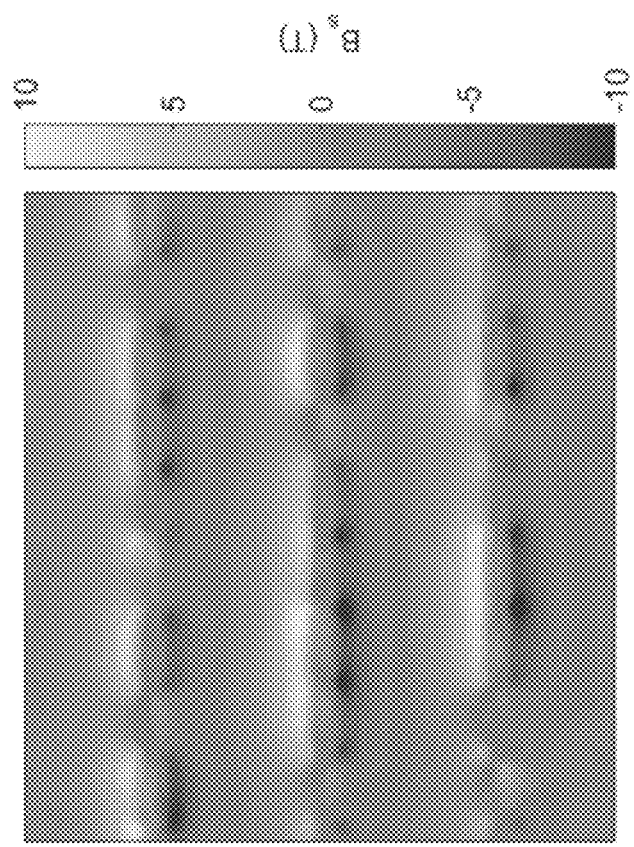
FIG. 1I: Non local average field B (units T, Tesla) calculated from pseudo magnetic field in (C) and (D) using equations (1)-(2).

In the following description of the preferred embodiment, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.

Technical Description

The present disclosure describes the use of nanoscale meta-structures to design the magnitude and spatial distribution of strain patterns that can achieve desirable electronic properties.

First Example: Strain-Engineered Graphene

FIGS. 1A-1H illustrates a strain engineered material 100 comprises a graphene sheet 102 including an array 104 of wrinkles 106. The wrinkles 106 are induced by deformations 108 formed in the graphene sheet 102 by a lattice 110 of underlying nanostructures 112 on a substrate 113.

FIGS. 2A-2H illustrates an example method for fabricating the strain engineered material by architecting nanostructures on the substrate and placing a large sheet of strain-free graphene on the arrays of architected nanostructures. The method comprises cleaning a substrate comprising a dielectric material (e.g., Si substrate 113 with SiO$_2$ layer on top), as shown in FIG. 2A, spin coating a mask material on the substrate (FIG. 2B), and using electron beam lithography to pattern an array of discs on the substrate (FIG. 2C), Example thicknesses of the dielectric material include, but are not limited to, a thickness between 250 rim and 300 nm thick. After development, Ni was deposited and used as a mask in a C$_4$F$_8$/O$_2$ reactive ion etching (RIE) environment to create Si nano-pillars (FIGS. 2D-2F). After etching, the substrate was immersed in the buffered oxide etch until the Ni discs fell from the top of the nano-cones (FIG. 2G). In some examples, a monolayer of h-BN was then transferred over the SiO$_2$ nano-cones prior to the transfer of graphene onto the architected nanostructures to form the strain engineered material.

As illustrated in FIGS. 1A-1H, the lattice of nanostructures comprises rows 115 of the nanostructures 112 arranged over an area of the substrate. In one or more examples, the nanostructures are arranged over an area so that each of the wrinkles comprise a ridge 114 aligned on top of a different one of the rows and along an alignment direction 115b defined by the rows. The nanostructures have an aspect ratio, a spatial density, and arrangement tailored to achieve a desired arrangement of the ridges, strain distribution, and/or pseudo-magnetic field distribution in the graphene sheet. In one example, the nanostructures are arranged over an area of at least 10 micrometers by 10 micrometers and the ridges have a length of at least 1 micrometer along the alignment direction. In one or more examples, the nanostructures comprise tapered structures having an aspect ratio (height divided by a base maximum width) variable by electron-beam lithography so as to determine and achieve the magnitude of the desirable strain (depending on the application). Example dimensions fir the nanostructures include, but are not limited to, a height and a base width in a range of 10-100 nanometers.

The periodic parallel graphene "wrinkles" give rise to periodic pseudo-magnetic field distributions realizable over realistic device scales (in a range of tens to hundreds of micrometers). FIGS. 1C and 1D (bottom panel) illustrate the deformations pattern a strain distribution in the graphene sheet that induces a periodically varying pseudo magnetic field 116 distribution ranging between positive 117*a* and negative 117*b* values. The peak field maxima magnitudes 119*a* are located parallel to and near each of the ridges 114 and field minima magnitudes 119*b* are located between the ridges. A difference between the peak field magnitudes 119*a* and the minimum field magnitudes 119*b* is dependent on the aspect ratios of the nanostructures, and for the specific nanostructures shown in FIGS. 1C and 1D (bottom panel) the maximum pseudo magnetic field magnitude is 300 Tesla.

FIG. 1I illustrates how the local magnetic field shown in FIG. 1F can be converted to an average non-local magnetic field using the following formulas [8]:

$$\langle B_s(x_0, y_0) \rangle = (2\pi l_0^2)^{-1} \int_{-X}^{X} dx \int_{-Y}^{Y} dy B_s(x, y) \times e^{-\frac{\sqrt{(x-x_0)^2 + (y-y_0)^2}}{l_0}} \quad (1)$$

$$l_0 = \left(\frac{h}{2e}\right)\mu\sqrt{\frac{n_{2D}}{\pi}} \quad (2)$$

Here the mean free path $l_0$ is related to the mobility ($\mu$) and the two-dimensional carrier density ($n_{2D}$) of graphene. Here $n_{2D}$ is equivalent to $|n_e|$ (in equation (3) below), which can be controlled by the backgate. For the example graphene sheet characterized in FIG. 1 and using the mean free path $l_0$=35 nm, the average non-local magnetic field is found to be $\langle B_x(x_0, y_0) \rangle$ =9.5 T, which agrees very well with the measurement of B using the slope in FIG. 9.

The electronic properties of strained graphene and the resulting device characteristics (such as the energy separations between Landau levels and the corresponding spin-splitting energies resulting from the pseudo-magnetic field) can be controlled by the magnitude and the spatial distribution of pseudo-magnetic fields. The magnitude of the strain-induced pseudo-magnetic field can be determined by tuning the aspect ratios of the lithographically defined nano-cones on the substrate, and the spatial distribution of the pseudo-magnetic field can be controlled by the spatial densities of the nano-cones (as illustrated in FIGS. 3 and 4) so as to design various valleytronic devices.

Second Example: Valley Splitter Device and Valley Propagator Devices a. Overview The graphene sheet 102 has an electronic band structure including a first valley (K valley) and a second valley (K' valley; see FIG. 8B for a schematic illustration of a valley 802). In valleytronic devices comprising the graphene sheet, the K- and K'-valleys of carriers correspond to carriers with right-handed and left-handed chiral momenta, respectively.

FIGS. 5A-5D illustrate molecular dynamics simulations demonstrating that wrinkles 106 comprising periodic ridges 114 can be used as valley splitters to separate the degenerate K- and K'-valleys of carriers in graphene when electrical currents are applied mostly perpendicular to the wrinkles. The periodically varying magnetic field 500 (induced by the strain distribution in the graphene sheet patterned by the nanostructures) spatially separates the current into (1) a first flow 501 in a first direction 502 and comprising first charge carriers in the first valley and (2) a second flow 503 in a second direction 504 and comprising second charge carriers in the second valley.

FIGS. 5E-5F show molecular dynamic simulations demonstrating that wrinkles 106 comprising periodic ridges 114 can also be used as valley propagators that preserve the valley polarization so that the separated K- or K'-valleys of carriers can propagate without being mixed with the other valley when electrical currents are applied mostly parallel to the wrinkles. In this case, the strain distribution is configured to form a periodically varying pseudo magnetic field comprising pairs 506 of parallel maximum magnitudes of positive 508 and negative 510 magnetic fields. A current 518 comprising different flows 520 of first charge carriers in the K valley is confined between each of the pairs 506 of parallel maximum magnitudes. Although FIGS. 5E-5F illustrate the current 518 confined in a K valley, in other examples, the current is confined between the pairs of parallel maximum magnitudes of positive and negative magnetic fields in a K' valley. FIG. 5F illustrates that the current 518 is still confined between the pairs 506 of parallel maximum magnitudes of positive 508 and negative 510 magnetic fields when the current is injected at an angle with respect to the pairs 506 of parallel maximum magnitudes of positive 508 and negative 510 magnetic fields. In the examples shown (including FIG. 7A), the electrodes injecting the current are wider than a plurality of the wrinkles so that the current (e.g., comprising flows 520 originating from different parts of an electrode) is distributed between several pairs 506.

b. Example Device Structures

Figure 6:
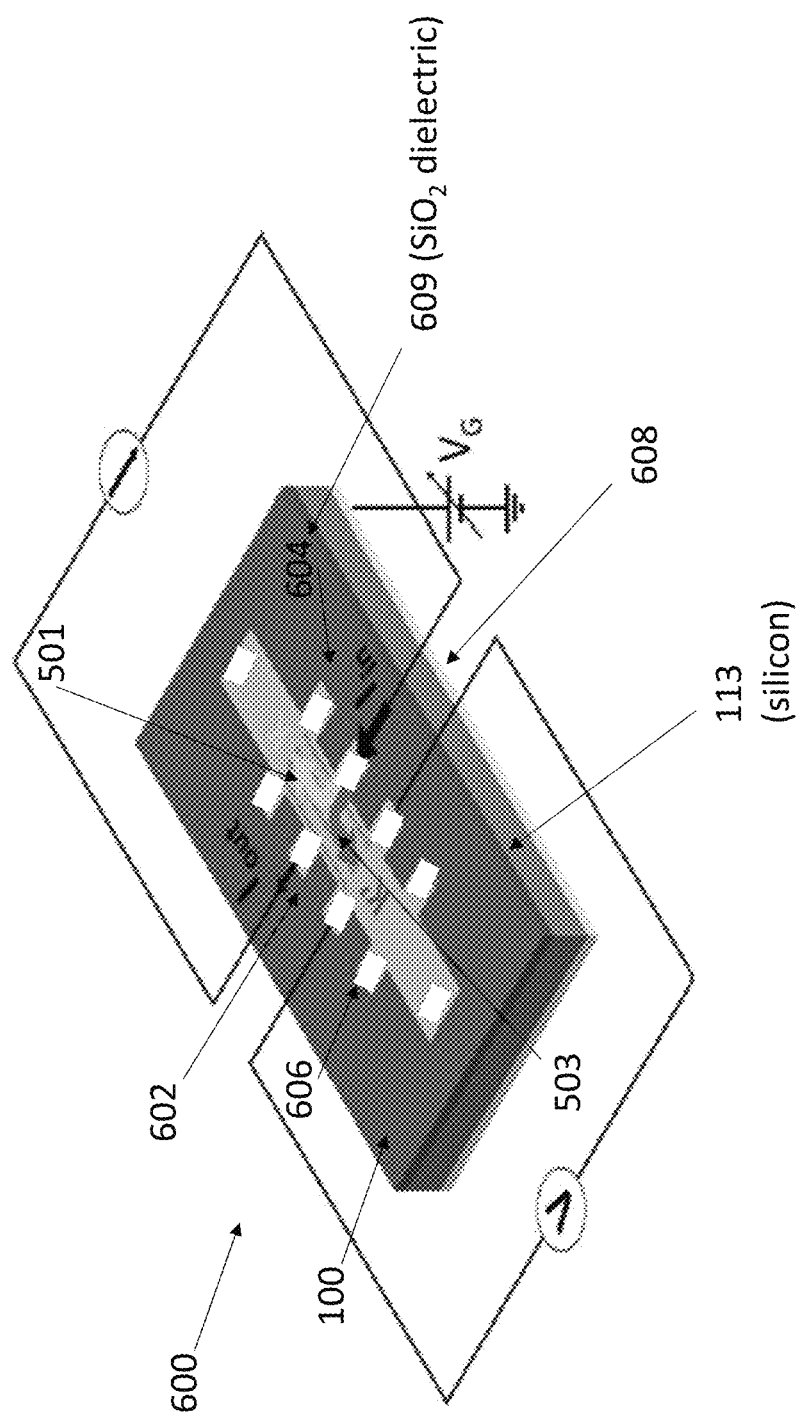
FIG. 6. Schematics of the experimental configuration for graphene-based valleytronics and spintronics. The blue-shaded area represents a patterned monolayer graphene/h-BN sample with strain-engineered periodic parallel wrinkles, and the purple region denotes a thin-layer of $SiO_2$ on top of a Si-substrate (grey region). (A) A graphene valley-Hall transistor: For graphene wrinkles parallel to the lone axis, an incident current ($I_{in}$) perpendicular to the wrinkles will lead to splitting of the K and K' Dirac fermions. Therefore, in addition to the longitudinal resistance (R) that may be determined, a non-local resistance ($R_{NL}$) may be detected from $R_{NL}$ in the perpendicular direction. By placing the graphene Hall bar on the $SiO_2$/Si substrate and attaching, a back gate to the Si, the Fermi level of the graphene can be controlled relative to the Dirac point by tuning the gate voltage ($V_G$) so that a sharp peak in $R_{NL}$-vs.-$V_G$ is expected when the Fermi level coincides with the Dirac point. This configuration is therefore a field effect transistor.
Figures 7A, 7B:
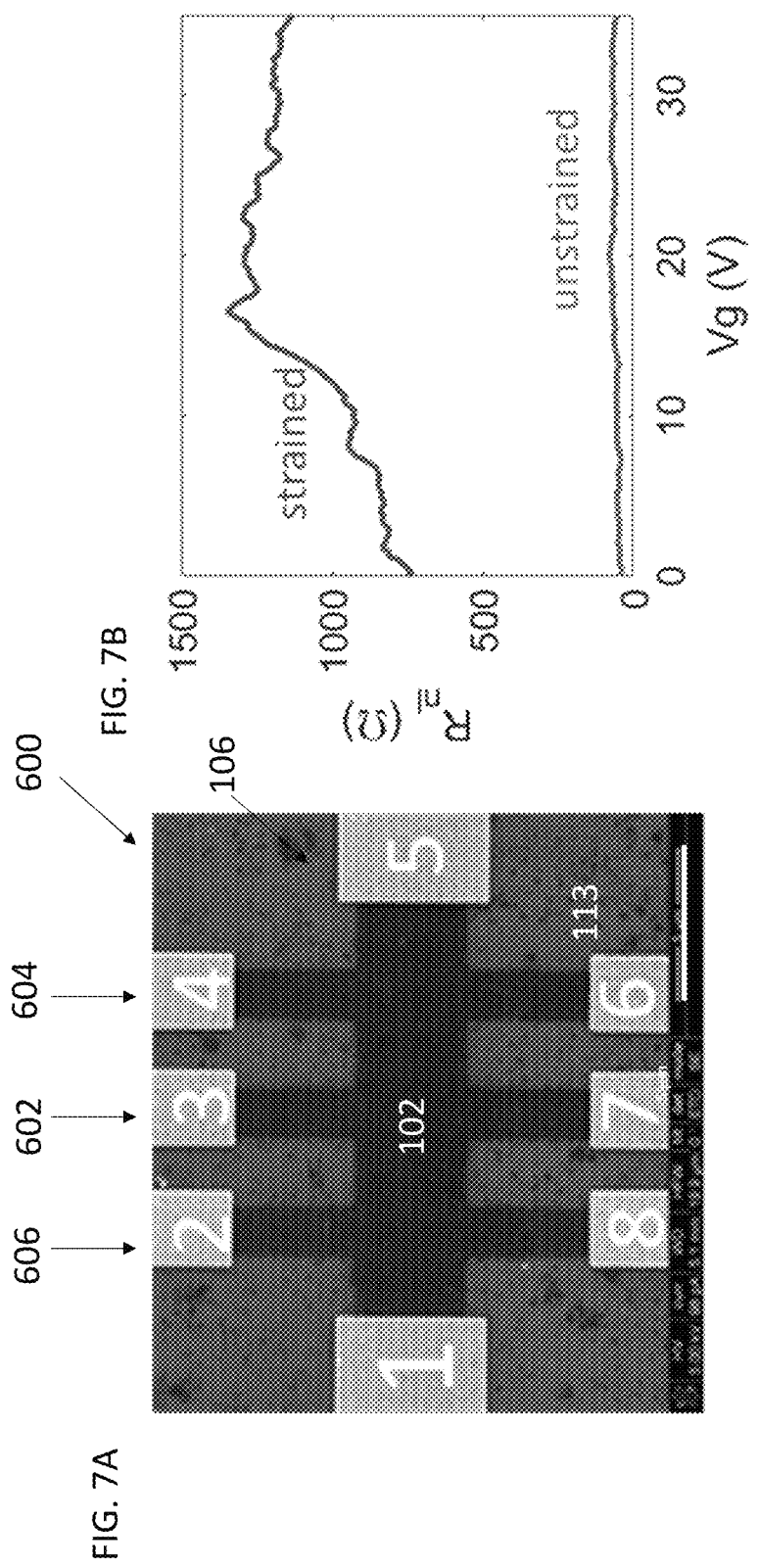
FIG. 7A: SEM image of a patterned valley-Hall transistor made of strained monolayer graphene (in black shade) with periodic parallel graphene wrinkles (as shown in FIG. 1) on a SiO$_2$/Si substrate (dark gray). The numbered rectangles (light gray) are gold-titanium electrical contacts.
FIG. 7B: Comparison of the non-local resistance ($R_{NL}$) measured across either contacts 4-6 or 2-8) vs. areal carrier density ($n_e$) at room temperature for electrical current applied along 3-7 of a valley Hall transistor based on strained graphene with the $R_{NL}$ of an unstrained graphene, showing negligible non-local resistance in the latter, in stark contrast to significant $R_{NL}$ in the formal due to the valley Hall effect of strained graphene. The areal carrier density ($n_e$) is controlled by the back-gate voltage ($V_g$) applied to the substrate consisting of a layer of 250 nm SiO$_2$ on top of Si. The $R_{NL}$ data were taken at room temperature for both the strained and unstrained graphene devices.

FIGS. 6 and 7A illustrate a valley splitter device 600 comprising the strain engineered material 100 and further including:

1. A first pair 602 of electrodes (3,7) contacting the graphene sheet 102 and separated by a first distance (e.g., in a range of 1-10 micrometers) across the wrinkles, so as to form a first channel channeling a flow of current $I_{in}$ in the graphene sheet 102 in a direction across the array of wrinkles. The periodically varying magnetic field 500 (induced by the strain distribution in the graphene sheet patterned by the nanostructures) spatially separates the current into (1) a first flow 501 in a first direction and comprising first charge carriers in the first valley and (2) a second flow 503 in a second direction and comprising second charge carriers in the second valley.

2. A second pair 604 of electrodes 4,6 electrically contacting the graphene sheet 102 and separated by a second distance (e.g., in a range of 1-10 micrometers) across the wrinkles, so as to measure a first voltage generated across the second pair 604 of electrodes 4, 6 by the first flow 501.

3. A third pair 606 of electrodes 2,8 electrically contacting the graphene sheet and separated by a second distance (e.g., in a range of 1-10 micrometers) across the wrinkles so as to measure a second voltage generated across the third pair of electrodes 2, 8 by the second flow 503.

4. A gate 608 coupled to the first channel (comprising current $I_{in}$) via a dielectric layer 609 so that a gate voltage applied to the gate 608 controls a density of the charge carriers in the first channel and a resistance of the material 100 measured using the first voltage or the second voltage varies as a function of the density.

FIG. 7A is an SEM image of an actual valley Hall effect transistor 600 showing the graphene sheet 102 patterned with arrays of strained graphene wrinkles into the valley-Hall transistor configuration. FIG. 7B illustrates detection of a non-local resistance $R_{NL}$ at room temperature by applying currents across contacts 3-7 and detecting the voltage across either 2-8 (for K'-valley polarized currents) or 4-6 (for K-valley polarized currents) while tuning the back-gate voltage on the $SiO_2$/Si substrate that controls the areal carrier density $n_e$ in the monolayer of graphene. For comparison, FIG. 7B also shows patterning an unstrained monolayer graphene into the same valley Hall transistor configuration does not yield any discernible non-local resistance $R_{NL}$. The significant $R_{NL}$ in strained graphene provides direct evidence for the valley Hall effect due to valley splitting.

Third Example: Observation of Hall Effect and Landau Levels

Figures 8A, 8B:
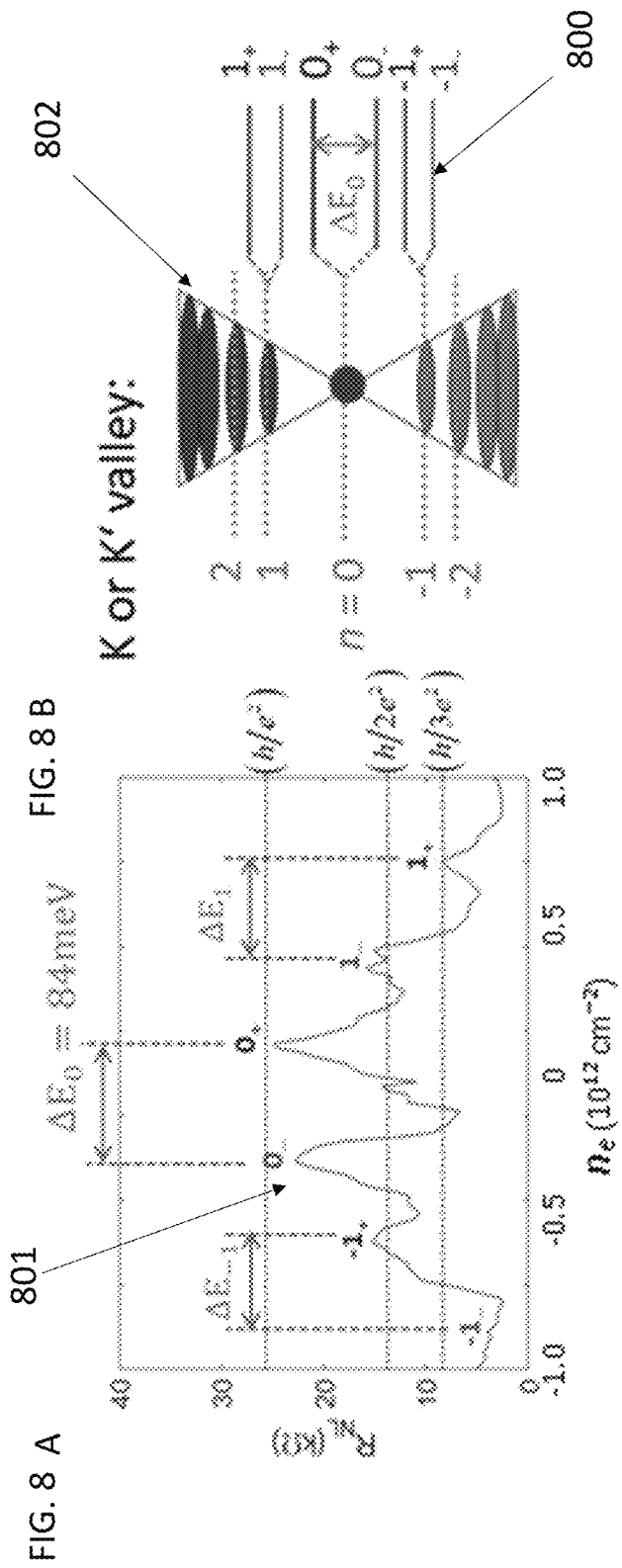
FIG. 8A: Non-local resistance ($R_{NL}$) of a strained graphene valley-Hall transistor taken at 1.8 K as a function of areal carrier density ($n_e$) showing quantum valley Hall resistance at h/e$^2$, h/(2e$^2$) and h/(3e$^2$) as the Fermi level is swept through the Dirac point (at n=0) across the Landau levels (for indices n=0, ±1, ±2 . . . ) induced by strain-induced pseudo-magnetic fields and further spin-splitting states ($0_\pm$, $+1_\pm$, $+2_\pm$. . . ) due to spontaneous symmetry breaking. Here the areal carrier density ($n_e$) is determined by the back-gate voltage applied to the SiO$_2$ (250 nm thick)/Si substrate.
FIG. 8B: Schematic illustration of the pseudo-magnetic field-induced Landau levels and further spin-split levels for the Dirac cone at either the K- or K'-valley. Here the Landau levels ($E_n$) relative to the Dirac point ($E_{Dirac}$) are given by $E_n - E_{Dirac} = \mathrm{sgn}(n)\sqrt{2|n|ev_F^2\hbar|B|}$, the spin-split energy separation for Landau level n=0 is given by $\Delta E_0 = e^2/(4\pi\varepsilon_0\varepsilon_r l_B)$, where $l_B = \sqrt{\hbar/(e|B|)}$ is the magnetic length for an averaged pseudo-magnetic field, and $v_F \sim 10^6$ m/s is the Fermi velocity of Dirac electrons in graphene. For the energy separations shown in (a), the corresponding averaged field is $|B| \sim 9.5$ Tesla, as illustrated in FIG. 9, which is consistent with $\Delta E_0 \approx 84$ meV.

Upon cooling the strained graphene in the device of FIG. 7A to sufficiently low temperatures, oscillations in the value of $R_{NL}$ appear as a function of the areal carrier density $n_e$ (which indicates the Fermi energy level relative to the Dirac point where $n_e$=0), as exemplified in FIG. 8(a) for data taken at a low temperature of 1.8 K. The $R_{NL}$ is found to show peaks 801 at quantum resistance values of $h/e^2$ ($\approx$25.8 k$\Omega$), $h/(2e^2)$ and $h/(3e^2)$ over the measured range of $n_e$, where h denotes the Plank constant (=6.626×10$^{-34}$ Joule-second) and e(=1.6×10$^{-19}$ coulomb) denotes the charge of a single electron. The observed phenomena can be understood as the manifestation of quantized Landau levels 800 at a single valley 802 due to strain-induced pseudo-magnetic fields and valley splitting, as illustrated in FIG. 8(B). In particular, the spin-degree of degeneracy for each Landau level is found to further split into two energy levels with an energy separation of $\Delta E_0 = e^2/(4\pi\varepsilon_0\varepsilon_r l_B)$ due to strong Coulomb interactions among strain-localized carriers, where $\varepsilon_r$ is the average dielectric constant of $SiO_2$ and air, and $\varepsilon_0$ is the vacuum permittivity. Thus, electron spins become spontaneously polarized in order to reduce the Coulomb repulsion, leading to spontaneous symmetry breaking and ferromagnetism. Here $l_B$ denotes the magnetic length associated with an averaged pseudo-magnetic field B and is given by $l_B = \sqrt{\hbar/(eB)}$.

Figure 9:
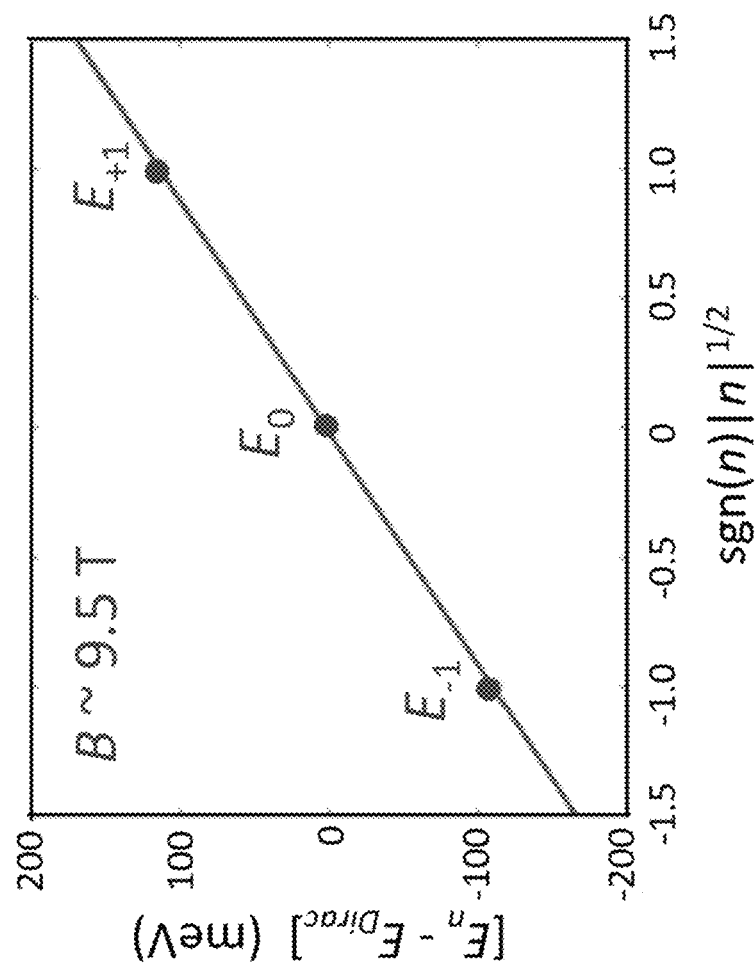
FIG. 9: Derivation of the averaged pseudo-magnetic field B from $E_n$-vs.-$|n|^{1/2}$, where the quantized energy levels $E = E_{n\pm}$ are associated with the resistive peaks at discrete $|n_e|$ values (see FIG. 8(A)) by the relation $E - E_{Dirac} = \mathrm{sgn}(n_e)\hbar v_F \sqrt{|n_e|\pi}$, and $E_n \equiv (E_{n+} + E_{n-})/2$. Using the relation $E_n - E_{Dirac} = \mathrm{sgn}(n)\sqrt{2|n|ev_F^2\hbar|B|}$, the slope of the red fitting curve corresponds to $\sqrt{2ev_F^2\hbar|B|}$ and the pseudo-magnetic field thus derived is $|B| \sim 9.5$ T.

The averaged pseudo-magnetic field |B| can be determined from the slope of $E_n$-vs.-$|n|^{1/2}$, where $E_n \equiv (E_{n+}+E_{n-})/2$ and n=0, ±1, ±2 ... as shown in FIG. 9. Specifically, $E_{n\pm}$ can be derived from the peaks in FIG. 9, where each peak corresponds to a specific two-dimensional carrier density $n_e$ that is directly related to the energy level E measured relative to the Dirac point ($E_{Dirac}$) at n=0 by the relation $$E - E_{Dirac} = \text{sgn}(n_e)\hbar v_F \sqrt{|n_e|\pi}. \quad (3)$$

Thus, we obtain the energy levels $E_n$ as shown in FIG. 9, and the slope corresponds to $\sqrt{2ev_F^2\hbar|B|}$, which yields an averaged pseudo-magnetic field |B|~9.5 Tesla, which is in excellent agreement with the results obtained using equations 1-3 and illustrated in FIG. 1E. The averaged pseudo-magnetic field is generally much smaller than the maximum local pseudo-magnetic field because of a much larger total area of strain-free regions than that of the strained regions.

Fourth Example: Observation of the Quantum Anomalous Hall Effect

Figure 10:
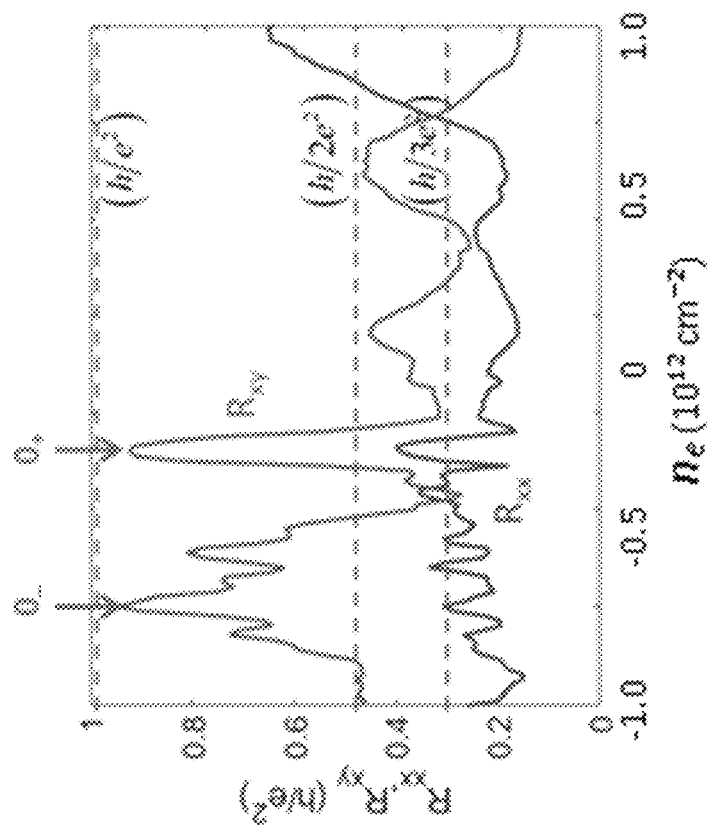
FIG. 10A: SEM image of the longitudinal and Hall resistance measurement configuration for a patterned valley-Hall transistor made of strained monolayer graphene (in black shade) with periodic parallel graphene wrinkles (as shown in FIG. 1) on SiO$_2$/Si substrate (dark gray). The numbered rectangles (light gray) are gold-titanium electrical contacts. The electrical current is applied along contacts 1-5, and the longitudinal resistance $R_{xx}$ (Hall resistance $R_{xy}$) is measured across contacts 2-4 (contacts 4-6).
FIG. 10B: Comparison of the longitudinal resistance ($R_{xx}$) and Hall resistance ($R_{xy}$) vs. areal carrier density ($n_e$) at 1.8 K, showing peaks at quantum anomalous Hall resistance values of (h/e$^2$) and h/(2e$^2$) in $R_{xy}$ at the spin-split zeroth Landau levels (0+ and 0−) and first Landau levels (+1+ and +1−), respectively.
Figure 10:
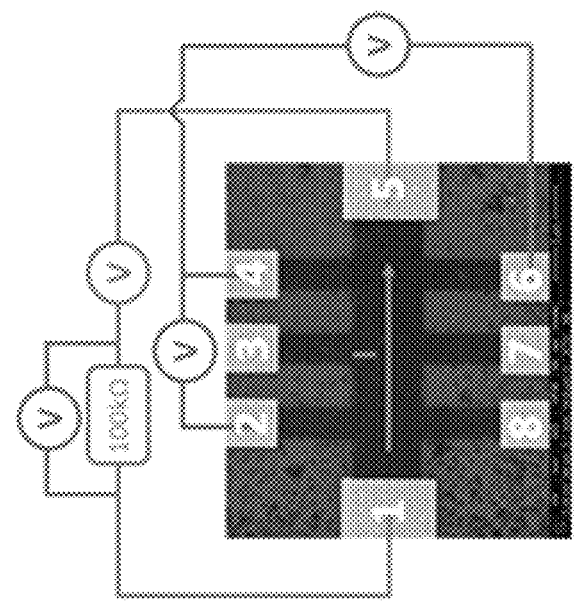

In addition to the quantum valley Hall effect demonstrated above, spin polarization due to spontaneous symmetry breaking leads to another quantum phenomenon, the quantum anomalous Hall effect, FIG. 10(A) shows the measurement configuration and in FIG. 10(B) illustrates the detected anomalous Hall signals by applying electrical current across contacts 1-5 and detecting the Hall resistance ($R_{xy}$) across contacts 4-6. In the absence of any external magnetic fields, the Hall resistance $R_{xy}$ cannot possibly appear unless there is finite magnetization due to the presence of ferromagnetism. Our strained graphene device not only exhibits $R_{xy}$ signals larger than the longitudinal resistance ($R_{xx}$ measured across contacts 2-4) but also reaches the values of quantum anomalous Hall resistance of $(h/e^2)$ and $h/(2e^2)$ for Fermi levels comparable to the same quantized energies where quantum valley Hall effect appears. This is the first observation of strain-induced quantum anomalous Hall effects, which evidences that strained graphene devices can induce ferromagnetism and spin-polarized currents for applications in non-dissipative spintronics.

Our observation of quantum valley Hall signals in strained graphene not only verifies our successful design of valley splitters and valley propagators by using periodic parallel graphene wrinkles, but also demonstrates a new paradigm for tuning the electronic interaction and correlation in graphene by controlling the magnitude and spatial distribution of strain through architected nanostructures.

Our ability to achieve valley splitting and to preserve valley polarization over extended spatial dimensions enables the implementation of graphene-based valleytronic devices for applications in lossless valley-Hall transistors and high-fidelity quantum information transport devices.

Fifth Example: Spintronic Devices

Figure 11:
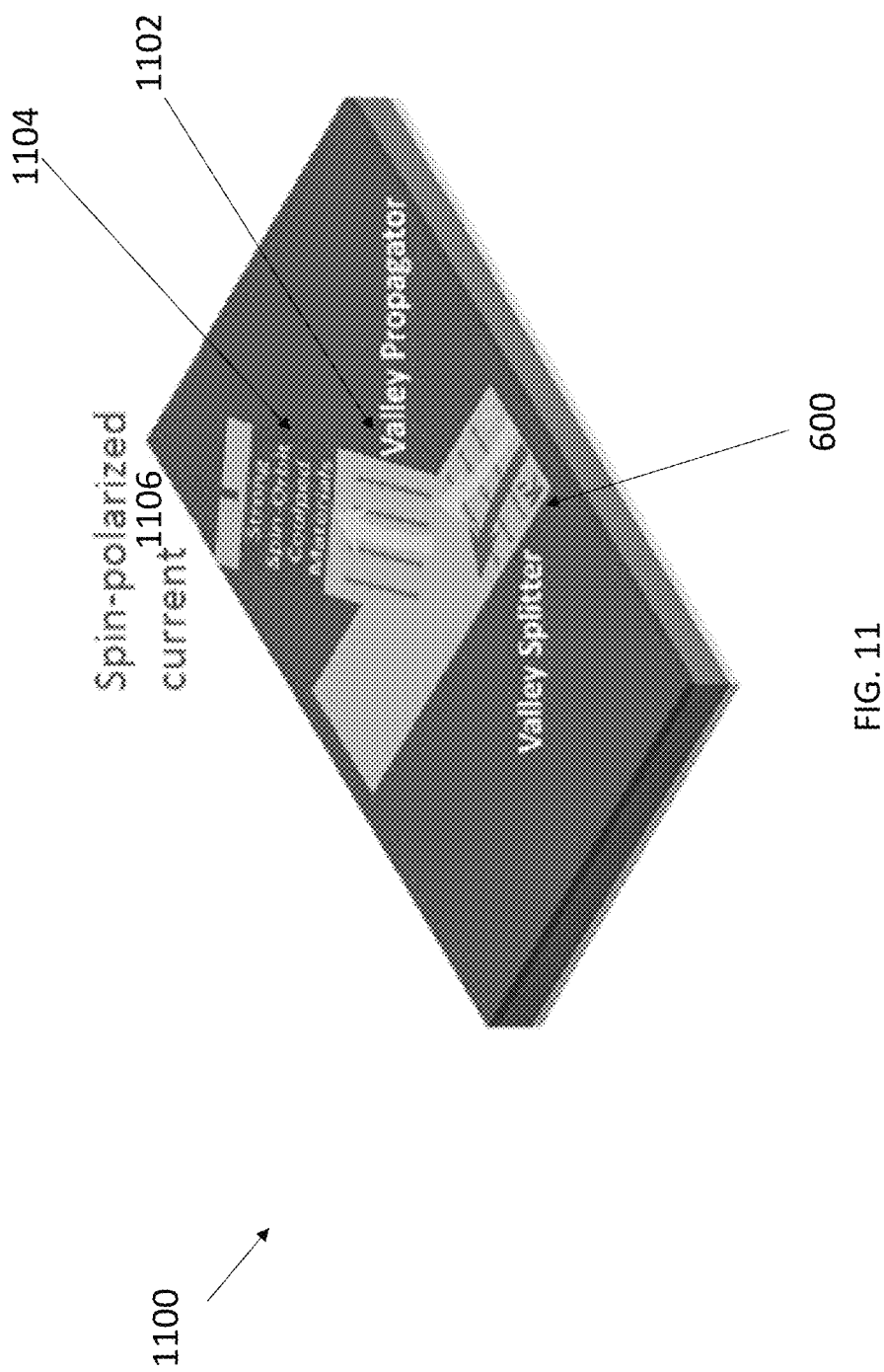
FIG. 11. A valleytronic-to-spintronic device: The combination of graphene-based valley-splitters and valley-propagators can lead to the generation of valley-polarized currents, as schematically illustrated by the yellow arrows for the trajectory of K-valley Dirac fermions. The injection of valley polarized currents into a strong spin-orbit-coupled material can further lead to outgoing spin-polarized currents for spintronic applications, FIG. 12. Flowchart illustrating a method of making a device.

FIG. 11 illustrates a spintronic device 1100 comprising a valley splitter device 600 outputting current comprising a first flow of K valley carriers and a valley propagator device 1102 coupled to an output of the valley splitter device. The valley propagator device guides the first flow of K valley carriers to a strong spin orbit coupled material 1104 that generates spin polarized current 1106 from the current of K valley carriers.

In other examples, a spintronic device comprises electrodes contacting the strain engineered material 100 so as to apply appropriate biases (e.g., gate voltages) and a cooling device cooling the strain engineered material to sufficiently low temperatures. In this way, the strain distribution induces spin-polarized electrical current in 1106 if the strained graphene sheet if under proper gate voltages and at a sufficiently low temperature.

Sixth Example: Strain-Induced Superconductivity in Monolayer Graphene

Figure 12:
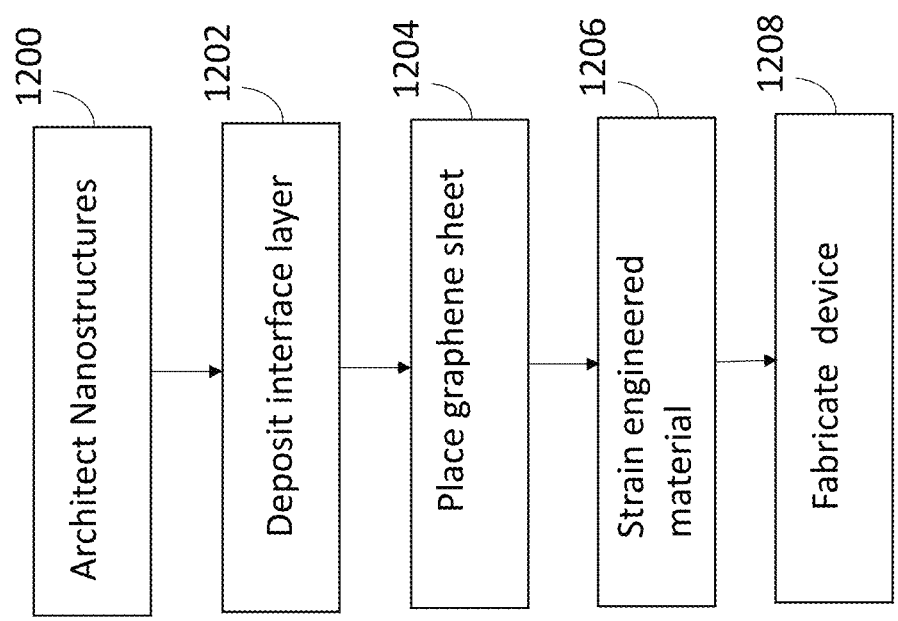

The discovery of superconductivity in bilayer graphene twisted at a "magic angle" [9] has kindled great interest in exploring "flat-band" materials [10] (i.e., materials with dispersionless energy-vs.-momentum relation) for induction of superconductivity. A theoretical proposal [11] describes that superconductivity may be more easily realized in topological flat bands induced by strain in graphene through periodic ripples and by including the effect of electronic correlation. It is argued that chiral d-wave superconductivity may be stabilized under strain even for slightly doped graphene and that superconductivity thus derived could exhibit the long-sought-after superconducting states with non-vanishing center-of-mass momentum for Cooper pairs [11]. In the limit of (J/t)~1 where J represents the antiferromagnetic coupling and t is the nearest-neighbor hopping energy, the theoretical conditions necessary for the occurrence of superconductivity are found to be (h/L)≥0.05 and $h^2/(La_0)$≥1, where h and L denote the height and periodic separation of the ripples, respectively, and $a_0$=0.142 nm is the nearest carbon-carbon distance for equilibrium graphene [11]. In some examples, the wrinkles 106 formed in the graphene sheet 102 described herein comprise ripples having values of h=20 nm and L=300 nm, so that both theoretical conditions (h/L)=0.067 and $h^2/(La_0)$=9.39 are satisfied, implying superconductivity can be achieved in the graphene sheet 102 comprising wrinkles 106 under the proper environmental conditions, Example Process Steps and Device Embodiments FIG. 12 is a flowchart illustrating a method of making a strain engineered material and devices comprising the same.

Block 1200 represents architecting or patterning a lattice of nanostructures on a substrate (e.g., on a dielectric material on a substrate), e.g., using electron beam lithography. In one or more examples, the patterning is tailored to achieve the desired strain induced effects. In some examples, the rows of nanofeatures are (1) not so close (e.g., less than 100 nm) that the strain in the graphene becomes too strong and causes the graphene to crack along the rows; and (2) not so far apart (e.g., greater than 1000 nm) that global strain-induced effects in devices cannot be sustained.

Block 1202 represents optionally depositing an interface layer BN) on the lattice of nanostructures.

Block 1204 represents placing or depositing a graphene sheet on or above the lattice of nanostructures (e.g., on the interface layer) so that the lattice of nanofeatures deforms the graphene sheet. In one or more examples, the graphene sheet is deposited using PECVD using the method described in [5].

Block 1206 represents the end result, a strain engineered material.

Block 1208 represents optionally patterning the graphene sheet with electrodes so as to form or fabricate a device including the strain engineered material.

Illustrative, non-exclusive examples of inventive subject matter according to the present disclosure are described in the following enumerated examples (referring also to FIGS. 1-12).

1. A strain engineered material (100), comprising:
a graphene sheet (102) comprising an array (104) of wrinkles (106) induced by deformations (108) in the graphene sheet (102), the deformations (108) formed by a lattice (110) of underlying nanofeatures (112) on a substrate (113), wherein:
the lattice (110) comprises rows (115) of the nanofeatures (112);
each of the wrinkles (106) comprise a ridge (114) aligned on top of a different one of the rows (115) and along an alignment direction (115b) defined by the rows (115);
the deformations (108) pattern a strain distribution in the graphene sheet (102) that induces a periodically varying pseudo magnetic field (116) distribution ranging between a positive value (117a) and a negative value (117b); and the periodically varying pseudo magnetic field distribution (116) has field magnitude minima (119b) located parallel to and between the ridges and field magnitude maxima (119a) located nearer to and parallel to each of the ridges.

2. The strain engineered material (100) of example 1, wherein:
the nanostructures (112) comprise tapered structures having a height and maximum base width in a range of 10-100 nm, a spacing between adjacent nanostructures (112) in the rows (115) is less than a spacing between the nanostructures (112) in adjacent rows (115), and a spacing between the rows (115) is in a range 200 to 400 nm or in a range of 100-1000 nanometers (nm).

3. A valley splitter device (600) comprising the strain engineered material 100) of example 1, further comprising:
a first pair (602) of electrodes (3,7) contacting the graphene sheet (102) and separated by a first distance across the wrinkles (106) so as to channel a flow of current (10 in the graphene sheet (102) in a direction across the array (104) of wrinkles (106); wherein:
the graphene sheet (102) has an electronic band structure including a first valley (802) and a second valley (802) and
the periodically varying pseudo magnetic field (500) spatially separates the current into a first flow (501) in a first direction (502) and comprising first charge carriers in the first valley (802) and a second flow (503) in a second direction (504) and comprising second charge carriers in the second valley (802).

4. The valley splitter device (600) of example 3, further comprising:
a second pair (604) of electrodes (2,8) electrically contacting the graphene sheet (102) separated by a second distance across the wrinkles (106) so as to measure a first voltage generated across the second pair (604) of electrodes (2, 8) by the first flow (501); and
a third pair (606) of electrodes (4,6) electrically contacting the graphene sheet (102) separated by a third distance across the wrinkles (106) so as to measure a second voltage generated across the third pair (606) of electrodes (4,6) by the second flow (503).

5. The valley splitter device (600) of example 4 comprising a valley Hall effect transistor, the transistor further comprising:
a gate (608) coupled to the graphene sheet (102) via a dielectric layer (609) so that a gate voltage applied to the gate (608) controls a density of the charge carriers in the transistor and a resistance of the graphene sheet (102) measured using the first voltage or the second voltage varies as a function of the density.

6. The valley splitter device (600) of example 4, further comprising: a gate (608) coupled to the graphene sheet (102) so as to control a density of the charge carriers in the current ($I_{in}$) flowing across the wrinkles (106); and a cooling device thermally coupled to the graphene sheet (102) so as to cool the graphene sheet (102) to a temperature such that:
the periodically varying pseudo magnetic field (500) interacts with the current (La) to generate a quantum valley Hall resistance of the graphene sheet (102) measured using the first voltage or the second voltage, wherein the quantum valley Hall resistance as a function of the density of charge carriers comprises peaks (0−, 0+) associated with the charge carriers occupying Landau levels (800) generated in the first valley (802) or the second valley (802) by the periodically varying pseudo magnetic field (500).

7. A spintronic device (1100) coupled to the valley splitter device (600) of example 3 and outputting a spin polarized current (1106) generated from the first flow (501).

8. A valley propagator device (1102 comprising the strain engineered material (100) of example 1, wherein:

the graphene sheet (102) comprises an electronic band structure including a first valley (802) and a second valley (802);

the device (1102) further comprises electrodes (1, 5) electrically contacting the graphene sheet (102) and positioned to channel a flow of current (518, 520) in one or more directions parallel to the wrinkles (106);

the current (518, 520) comprises charge carriers comprising at least one of first charge carriers in the first valley (802) or second charge carriers in the second valley (802);

the periodically varying pseudo magnetic field comprises multiple pairs (506) of adjacent parallel maximum magnitudes of positive (508) and negative (510) magnetic fields; and one or more flows (520) of the first charge carriers are confined in the first valley, or one or more flows (520) of the second charge carriers are confined in the second valley, between adjacent ones of the parallel maximum magnitudes of positive (508) and negative (510) magnetic fields, so that one or more of the multiple pairs (506) guide the current (518) in the one or more directions parallel to the wrinkles (106) and in a direction along or parallel to the alignment direction (115*b*) defined by the rows (115) of nanostructures (112). In one or more examples, each of the flows originate from different positions of an electrode.

9. A spintronic device (1100) coupled to the valley propagator device (1102) of example 8, wherein the spintronic device (1100) generates a spin polarized current (1106) from the current (518, 520) outputted from the valley propagator device (1102).

10. The spin engineered material (100) of example 1, wherein the strain distribution induces spin-polarized electrical current (1106) in the graphene sheet (102) under proper gate voltages applied to the graphene sheet (102) and at sufficiently low temperatures.

11. A Hall effect device comprising the strain engineered material (100) of example 1, further comprising:

a pair of electrodes (1, 5) positioned to channel a flow of current (I) in graphene sheet (102) along a longitudinal direction parallel to the wrinkles (106);

a pair of electrodes (4,6) separated across the wrinkles (106) and measuring a Hall resistance using a voltage generated across the pair of electrodes (4,6) in response to the current (I); and a cooling device thermally coupled to the graphene sheet (102) so as to cool the graphene sheet (102) to a temperature; wherein:

the graphene sheet (102) comprises an electronic hand structure including a plurality of valleys (802); and the periodically varying pseudo magnetic field (500) interacts with the current (I) so as to generate an anomalous quantum Hall resistance measured using the voltage and such that the anomalous quantum Hall resistance as a function of the density of charge carriers comprises peaks (0−, 0+) having values proportional to ($h/e^2$) associated with the charge carriers occupying spin split Landau levels (800) generated in each of the valleys by the periodically varying pseudo magnetic field (500).

12. A spintronic device (1100) comprising the strain engineered material (100) of example 1, further comprising:

a pair of electrodes (1, 5, 3, 7) electrically contacting the graphene sheet (102) so as to channel a flow of current (I, $I_{in}$) in the graphene sheet (102), the current (I, $I_{in}$) comprising charge carriers; wherein:

the graphene sheet (102) comprises an electronic band structure comprising valleys (802); and the strong Coulomb repulsion among charge carriers due to strain-induced spatial confinement polarizes spins of the charge carriers occupying Landau levels (800), where the Landau levels (800) are generated in each of the valleys (802) by the periodically varying pseudo magnetic field (500).

13. A transistor comprising the material (100) of example 1.

14. The strain engineered material (100) of example 1, wherein: the deformations (108) pattern a strain distribution in the graphene sheet (102) that induces superconductivity in the graphene sheet (102).

15. A method of making a strain engineered material (100), comprising:

depositing a graphene, sheet (102) on a lattice (110) of nanostructures (112), wherein:

the lattice (110) deforms the graphene sheet (102) so as to induce a periodic array (104) of wrinkles (106) in the graphene sheet (102);

each of the wrinkles (106) comprise a ridge (114) aligned on top of a different one of the rows (115) and along an alignment direction (115*b*) defined by the rows (15);

the deformations (108) pattern a strain distribution in the graphene sheet (102) that induces a periodically varying pseudo magnetic field (116) magnetic field (500) distribution ranging between a positive (508, 514) value and a negative (510) value; and the periodically varying pseudo magnetic field (116) magnetic field (500) distribution has field magnitude minima located parallel to and between the ridges and field magnitude maxima located nearer to and parallel to each of the ridges.

16. The method of example 15, further comprising lithographically patterning the nanostructures (112) on a substrate (113) (e.g., using electron beam lithography) and growing the graphene sheet (102) comprising strain free graphene using Plasma-enhanced chemical vapor deposition (PECVD).

17. The method or device of any of the examples, wherein the graphene sheet is one monolayer thick.

18. The method or device of any of the examples 1-17, wherein the pseudo magnetic field results from the strain distribution comprising a shear strain greater than 1% or greater than 10%. In one or more examples, the total magnetic flux enclosed in the sample area with strain-induced pseudo magnetic fields is zero, and therefore the strain-induced pseudo magnetic field only breaks local time-reversal symmetry but does not break global time-reversal symmetry.

19. The strain engineered material of any of the examples 1-18, further comprising an interlayer or interface layer between the dielectric material and the graphene sheet, wherein the interlayer or interface layer decouples extrinsic interactions between the graphene sheet and the substrate, and/or the interlay or interface layer suppresses, blocks, or prevents movement and coupling of (e.g., charge) impurities and lattice vibrations from the substrate (e.g., the dielectric material) to the graphene sheet, and Wherein the suppressed coupling comprise charge impurities and phonon modes from the substrate that would degrade electrical properties (e.g., mobility or two dimensional charge transport) of the graphene sheet.

20. The strain engineered material of any of the examples 1-19, wherein the substrate comprises silicon, the dielectric material comprises silicon dioxide, and the interlayer comprises hexagonal boron nitride (e.g., a monolayer of hexagonal boron nitride).

21. The strain engineered material of any of the examples 1-20, wherein a spacing S between the rows (115) of nanofeatures is small enough to induce a strain creating the pseudo magnetic field but not so small that the induced strain causes the graphene sheet to crack along the rows. In one or more examples, these conditions are met with 100 nm≤S≤1000 nm.

REFERENCES

The following references are incorporated by reference herein.

[1] Guinea, F., Katsnelson, M. I. and Vozmediano, M. A. H. Midgap states and charge inhomogeneities in corrugated graphene. *Phys. Rev. B* 77, 075422 (2008).
[2] Guinea F. et al. Energy gaps and a zero-field quantum Hall effect in graphene by strain engineering. *Nat. Phys.* 6, 30-33 (2010).
[3] Teague, M. L. et al. Evidence for strain-induced local conductance modulations in single-layer graphene on $SiO_2$. Nano Lett. 9, 2542-2546 (2009).
[4] Levy N. et al. Strain-induced pseudomagnetic fields greater than 300 Tesla in graphene nanobubbles. Science 329, 544 (2010).
[5] Yeh N.-C. et al, Strain-induced pseudomagnetic fields and charging effects on CVD-grown graphene. Surf. Sci. 605, 1649-1656 (2011).
[6] Yeh N.-C. et al. Nanoscale strain engineering of graphene and graphene-based devices. Acta Mech. Sin. 32, 497-509 (2016).
[7] Boyd D. A. et al. Single-step deposition of high-mobility graphene at reduced temperatures Nature Communications 6, 6620 (2015).
[8] N.-C. Yeh et al., ActaMechanicaSinica32, 497-509 (2016)
[9] Cao, Y. et al. Unconventional superconductivity in magic-angle graphene superlattices. *Nature* 556, 80 (2018).
[10] Bistritzer, R. &. MacDonald, A. H. Moire bands in twisted double-layer graphene. *Proc. Natl Acad. Sci. USA* 108, 12233-12237 (2011).
[11] Xu, F. et al. Strain-induced superconducting pair density wave states in graphene. *Phys. Rev. B* 98, 205103 (2018).
[12] Nanoscale strain engineering of giant pseudo-magnetic fields, valley polarization, and topological channels in graphene, C.-C. Hsu, M. L. Teague, J.-Q. Wang, and N.-C. Yeh, *Science Advances* 8 May 2020: Vol. 6, no. 19, eaat.9488, DOI: 10.11261/sciadv.aat9488, https://advances.sciencemag.org/content/6/19/eaat9488/tab-pdf.
[13] U.S. Pat. No. 10,837,102 entitled "Method and System for graphene formation," by David A. Boyd and Nai-Chang Yeh.
[14] U.S. Pat. No. 10,465,291 entitled "Method and System for growth of graphene nanostripes by plasma enhanced chemical vapor deposition," by Nai-Chong Yeh and Chen-Chih Hsu.
[15] U.S. Pat. No. 10,041,168 entitled "Graphene Structure" by David A. Boyd and Nai-Chang Yeh.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A strain engineered material, comprising:
a graphene sheet comprising an array of wrinkles induced by deformations in the graphene sheet, the deformations formed by a lattice of underlying nanostructures on a substrate comprising a dielectric material, wherein:
the lattice comprises rows of the nanostructures;
each of the wrinkles comprise a ridge aligned on top of a different one of the rows and along an alignment direction defined by the rows;
the deformations pattern a strain distribution in the graphene sheet that induces a periodically varying pseudo magnetic field distribution ranging between a positive value and a negative value; and
the periodically varying pseudo magnetic field distribution has field magnitude minima located parallel to and between the ridges and field magnitude maxima located nearer to (as compared to the minima) and parallel to each of the ridges.

2. The strain engineered material of claim 1, further comprising an interlayer between the dielectric material and the graphene sheet, wherein the interlayer suppresses movement and coupling of charge impurities and phonon modes from the substrate that degrade electrical properties of the graphene sheet.

3. The strain engineered material of claim 2, wherein the substrate comprises silicon, the dielectric material comprises silicon dioxide, and the interlayer comprises hexagonal boron nitride.

4. The strain engineered material of claim 1, wherein:
the nanostructures comprise tapered structures having a height and maximum base width in a range of 10-100 nm, a spacing between adjacent nanostructures in the rows is less than a spacing between the nanostructures in adjacent rows, and a spacing between the rows is in a range of 100-1000 nm.

5. A valley splitter device comprising the strain engineered material of claim 1, further comprising:
a first pair of electrodes contacting the graphene sheet and separated by a first distance across the wrinkles so as to channel a flow of current in the graphene sheet in a direction across the array of wrinkles; wherein:
the graphene sheet has an electronic band structure including a first valley and a second valley; and
the periodically varying pseudo magnetic field spatially separates the current into a first flow in a first direction and comprising first charge carriers in the first valley and a second flow in a second direction and comprising second charge carriers in the second valley.

6. The valley splitter device of claim 5, further comprising:

a second pair of electrodes electrically contacting the graphene sheet separated by a second distance across the wrinkles so as to measure a first voltage generated across the second pair of electrodes by the first flow; and a third pair of electrodes electrically contacting the graphene sheet separated by a third distance across the wrinkles so as to measure a second voltage generated across the third pair of electrodes by the second flow.

7. The valley splitter device of claim 6 comprising a valley Hall effect transistor, the transistor further comprising:
a gate coupled to the graphene sheet via a dielectric layer so that a gate voltage applied to the gate controls a density of the charge carriers in the transistor comprising the graphene sheet and a resistance of the graphene sheet measured using the first voltage or the second voltage varies as a function of the density.

8. The valley splitter device of claim 6, further comprising:
a gate coupled to the graphene sheet so as to control a density of the charge carriers in the current flowing across the wrinkles; and
a cooling device thermally coupled to the graphene sheet so as to cool the graphene sheet to a temperature such that:
the periodically varying pseudo magnetic field interacts with the current to generate a quantum valley Hall resistance of the graphene sheet measured using the first voltage or the second voltage, wherein the quantum valley Hall resistance as a function of the density of charge carriers comprises peaks associated with the charge carriers occupying Landau levels generated in the first valley or the second valley by the periodically varying pseudo magnetic field.

9. A spintronic device coupled to the valley splitter device of claim 5 and outputting a spin polarized current generated from the first flow.

10. A valley propagator device comprising the strain engineered material of claim 1, wherein:
the graphene sheet comprises an electronic band structure including a first valley and a second valley;
the device further comprises electrodes electrically contacting the graphene sheet and positioned to channel allow of current in one or more directions parallel to the wrinkles;
the current comprises charge carriers comprising at least first charge carriers in the first valley or second charge carriers in the second valley;
the periodically varying pseudo magnetic field comprises multiple pairs of adjacent parallel maximum magnitudes of positive and negative magnetic fields; and
one or more flows of the charge carriers are confined, in the first valley or the second valley, between adjacent ones of the parallel maximum magnitudes of positive and negative magnetic fields, so that one or more of the multiple pairs guide the current in the one or more directions parallel to the wrinkles and along the alignment direction defined by the rows of nanostructures.

11. A spintronic device coupled to the valley propagator device of claim 10, wherein the spintronic device generates a spin polarized current from the current outputted from the valley propagator device.

12. The spin engineered material of claim 1, wherein the strain distribution induces spin-polarized electrical current in the graphene sheet under proper gate voltages applied to the graphene sheet and at sufficiently low temperatures.

13. A Hall effect device comprising the strain engineered material of claim 1, further comprising:
a first pair of electrodes positioned to channel a flow of current in graphene sheet along a longitudinal direction parallel to the wrinkles;
a second pair of electrodes separated across the wrinkles and measuring a Hall resistance using a voltage generated across the second pair of electrodes in response to the current; and
a cooling device thermally coupled to the graphene sheet so as to cool the graphene sheet to a temperature;
wherein:
the graphene sheet comprises an electronic band structure including a plurality of valleys; and
the periodically varying pseudo magnetic field interacts with the current so as to generate an anomalous quantum Hall resistance measured using the voltage and such that the anomalous quantum Hall resistance as a function of the density of charge carriers comprises peaks having values proportional to $(h/e^2)$ associated with the charge carriers occupying spin split Landau levels generated in each of the valleys by the periodically varying pseudo magnetic field.

14. A spintronic device comprising the strain engineered material of claim 1,
further comprising:
a pair of electrodes electrically contacting the graphene sheet so as to channel a flow of current in the graphene sheet, the current comprising charge carriers; wherein:
the graphene sheet comprises an electronic band structure comprising valleys; and
a Coulomb repulsion among charge carriers due to strain-induced spatial confinement polarizes spins of the charge carriers occupying Landau levels, where the Landau levels are generated in each of the valleys by the periodically varying pseudo magnetic field.

15. A transistor comprising the material of claim 1.

16. The strain engineered material of claim 1, wherein:
the deformations pattern a strain distribution in the graphene sheet that induces superconductivity in the graphene sheet.

17. A method of making a strain engineered material, comprising:
depositing a graphene sheet on a lattice of nanofeatures, wherein:
the lattice comprises rows of the nanofeatures,
the lattice deforms the graphene sheet so as to induce a periodic array of wrinkles in the graphene sheet;
each of the wrinkles comprise a ridge aligned on top of a different one of the rows and along an alignment direction defined by the rows;
the deformations pattern a strain distribution in the graphene sheet that induces a periodically varying pseudo magnetic field distribution ranging between a positive value and a negative value; and
the periodically varying pseudo magnetic field distribution has field magnitude minima located parallel to and between the ridges and field magnitude maxima located near to and parallel to each of the ridges.

18. The method of claim 17, further comprising:
lithographically patterning the nanofeatures on a substrate comprising a dielectric material and using electron beam lithography; and
growing the graphene sheet comprising strain free graphene using Plasma-enhanced chemical vapor deposition (PECVD).

19. The method of claim 18, wherein the substrate comprises silicon, the dielectric material comprises silicon dioxide, the method further comprising depositing hexagonal boron nitride on the dielectric material and depositing the graphene sheet on the hexagonal boron nitride.

20. The method of claim 17, wherein:
the nanostructures comprise tapered structures having a height and maximum base width in a range of 10-100 nm, a spacing between adjacent nanostructures in the rows is less than a spacing between the nanostructures in adjacent rows, and a spacing between the rows is in a range of 100-1000 nm.

\* \* \* \* \*